(12) United States Patent
Lin

(10) Patent No.: US 7,459,761 B2
(45) Date of Patent: Dec. 2, 2008

(54) HIGH PERFORMANCE SYSTEM-ON-CHIP USING POST PASSIVATION PROCESS

(75) Inventor: Mou-Shiung Lin, Hsinchu (TW)

(73) Assignee: Megica Corporation, Hsin-Chu (TW)

( * ) Notice: Subject to any disclaimer, the term of this patent is extended or adjusted under 35 U.S.C. 154(b) by 0 days.

(21) Appl. No.: 11/092,379

(22) Filed: Mar. 29, 2005

(65) Prior Publication Data
US 2005/0184358 A1 Aug. 25, 2005

Related U.S. Application Data

(60) Division of application No. 10/303,451, filed on Nov. 25, 2002, now Pat. No. 6,897,507, which is a continuation of application No. 10/156,590, filed on May 28, 2002, now Pat. No. 6,489,647, which is a division of application No. 09/970,005, filed on Oct. 3, 2001, now Pat. No. 6,455,885, which is a division of application No. 09/721,722, filed on Nov. 27, 2000, now Pat. No. 6,303,423, which is a continuation-in-part of application No. 09/637,926, filed on Aug. 14, 2000, now abandoned, which is a continuation-in-part of application No. 09/251,183, filed on Feb. 17, 1999, now Pat. No. 6,383,916, which is a continuation-in-part of application No. 09/216,791, filed on Dec. 21, 1998, now abandoned.

(51) Int. Cl.
| | |
|---|---|
| H01L 21/4763 | (2006.01) |
| H01L 29/40 | (2006.01) |
| H01L 21/338 | (2006.01) |
| H01L 21/337 | (2006.01) |
| H01L 21/8238 | (2006.01) |
| H01L 21/8234 | (2006.01) |

(52) U.S. Cl. ............... 257/528; 257/379; 257/516; 257/758; 257/759; 257/760; 438/171; 438/190; 438/210; 438/238; 438/329; 438/381

(58) Field of Classification Search ............. 257/773
See application file for complete search history.

(56) References Cited

U.S. PATENT DOCUMENTS 5,055,907 A 10/1991 Jacobs (Continued)

FOREIGN PATENT DOCUMENTS

| EP | 0 986 106 A1 | 3/2000 |
|---|---|---|
| EP | 0 999 580 A2 | 5/2000 |
| EP | 1 039 544 A1 | 9/2000 |
| FR | 279343 | 5/1999 |
| JP | 403019358 | * 1/1991 |
| JP | 2000-022085 | 1/2000 |

OTHER PUBLICATIONS

"Spiral Inductors and Transmission Lines in Silicon Technology Using Copper—Damescene Interconnects and Low-Loss Substrates", by Joachim N. Burghartz et al., XP-000/04848 IEEE 1997 Theory and Techniques, vol. 45, No. 10, Oct. 1997, pp. 1961-1968.
"The Effects of a Ground Shield on Spiral Inductors Fabricated in a Silicon Bipolar Technology", IEEE BETM 9.1 by Seang-Mo Yim et al., pp. 157-160, 2000 IEEE.

*Primary Examiner*—Zandra V. Smith
*Assistant Examiner*—James M Mitchell
(74) *Attorney, Agent, or Firm*—Saile Ackerman LLC; Stephen B. Ackerman; Rosemary L. S. Pike

(57) ABSTRACT

The present invention extends the above referenced continuation-in-part application by in addition creating high quality electrical components, such as inductors, capacitors or resistors, on a layer of passivation or on the surface of a thick layer of polymer. In addition, the process of the invention provides a method for mounting discrete electrical components at a significant distance removed from the underlying silicon surface.

14 Claims, 11 Drawing Sheets

U.S. PATENT DOCUMENTS

| | | |
|---|---|---|
| 5,106,461 A | 4/1992 | Volfson et al. |
| 5,212,403 A | 5/1993 | Nakanishi et al. |
| 5,370,766 A * | 12/1994 | Desaigoudar et al. ......... 216/13 |
| 5,372,967 A | 12/1994 | Sundaram et al. |
| 5,384,274 A * | 1/1995 | Kanehachi .................. 438/381 |
| 5,501,006 A | 3/1996 | Gehman, Jr. et al. |
| 5,576,680 A | 11/1996 | Ling |
| 5,635,767 A | 6/1997 | Wenzel et al. |
| 5,656,849 A * | 8/1997 | Burghartz et al. ........... 257/528 |
| 5,686,764 A | 11/1997 | Fulcher |
| 5,874,770 A * | 2/1999 | Saia et al. ................... 257/536 |
| 5,884,990 A | 3/1999 | Burghartz et al. |
| 6,002,161 A * | 12/1999 | Yamazaki ................... 257/531 |
| 6,008,102 A | 12/1999 | Alford et al. |
| 6,025,261 A | 2/2000 | Farrar et al. |
| 6,031,445 A | 2/2000 | Marty et al. |
| 6,040,226 A | 3/2000 | Wojnarowski et al. |
| 6,133,079 A * | 10/2000 | Zhu et al. ................... 438/210 |
| 6,180,445 B1 * | 1/2001 | Tsai ........................... 438/238 |
| 6,184,159 B1 * | 2/2001 | Lou et al. ................... 438/791 |
| 6,191,468 B1 * | 2/2001 | Forbes et al. ................ 257/531 |
| 6,221,727 B1 * | 4/2001 | Chan et al. .................. 438/381 |
| 6,242,791 B1 * | 6/2001 | Jou ............................. 257/531 |
| 6,255,714 B1 * | 7/2001 | Kossives et al. ............. 257/528 |
| 6,420,773 B1 * | 7/2002 | Liou ........................... 257/531 |
| 6,429,764 B1 | 8/2002 | Karam et al. |
| 6,440,750 B1 * | 8/2002 | Feygenson et al. ............. 438/3 |
| 6,441,715 B1 * | 8/2002 | Johnson ...................... 336/200 |
| 6,459,135 B1 * | 10/2002 | Basteres et al. ............. 257/528 |
| 6,478,773 B1 | 11/2002 | Gandhi et al. |
| 6,504,227 B1 * | 1/2003 | Matsuo et al. .............. 257/531 |
| 6,545,354 B1 * | 4/2003 | Aoki et al. .................. 257/734 |
| 6,559,409 B1 * | 5/2003 | Cadet .................... 219/121.68 |
| 6,566,731 B2 * | 5/2003 | Ahn et al. ................... 257/531 |
| 6,903,459 B2 * | 6/2005 | Nakatani .................... 257/758 |
| 7,012,339 B2 * | 3/2006 | Terui .......................... 257/786 |
| 2001/0016410 A1 * | 8/2001 | Cheng et al. ................ 438/622 |
| 2001/0019168 A1 * | 9/2001 | Willer et al. ................ 257/639 |
| 2001/0028098 A1 * | 10/2001 | Liou ........................... 257/531 |
| 2002/0000665 A1 * | 1/2002 | Barr et al. ................... 257/758 |
| 2002/0017730 A1 * | 2/2002 | Tahara et al. ................ 257/786 |
| 2002/0050626 A1 * | 5/2002 | Onuma et al. ............... 257/531 |
| 2003/0076209 A1 * | 4/2003 | Tsai et al. ................... 336/200 |

* cited by examiner

HIGH PERFORMANCE SYSTEM-ON-CHIP USING POST PASSIVATION PROCESS

This application is a divisional of Ser. No. 10/303,451, filing date Nov. 25, 2002 now U.S. Pat. No. 6,897,507, which is a Continuation of Ser. No. 10/156,590, filing date May 28, 2002, now issued as U.S. Pat. No. 6,489,647, which is a Divisional Application of Ser. No. 09/970,005, filing date Oct. 3, 2001, now U.S. Pat. No. 6,455,885, which is a Divisional Application of Ser. No. 09/721,722, filing date Nov. 27, 2000, now U.S. Pat. No. 6,303,423 which is a continuation-in-part of Ser. No. 09/637,926, filing date Aug. 14, 2000, now abandoned, which is a continuation-in-part of Ser. No. 09/251,183, filing date Feb. 17, 1999, now issued as U.S. Pat. No. 6,383,916, which is a continuation-in-part of Ser. No. 09/216,791, filing date Dec. 21, 1998, now abandoned, all of which are herein incorporated by reference in their entirety.

BACKGROUND OF THE INVENTION (1) Field of the Invention

The invention relates to the manufacturing of high performance Integrated Circuit (IC's), and, more specifically, to methods of creating high performance electrical components (such as an inductor) on the surface of a semiconductor substrate by reducing the electromagnetic losses that are typically incurred in the surface of the substrate.

(2) Description of the Prior Art

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices that are at this time being created are aimed at processing digital data. There are however also numerous semiconductor designs that are aimed at incorporating analog functions into devices that simultaneously process digital and analog data, or devices that can be used for the processing of only analog data. One of the major challenges in the creation of analog processing circuitry (using digital processing procedures and equipment) is that a number of the components that are used for analog circuitry are large in size and are therefore not readily integrated into devices that typically have feature sizes that approach the sub-micron range. The main components that offer a challenge in this respect are capacitors and inductors, since both these components are, for typical analog processing circuits, of considerable size.

A typical application for inductors of the invention is in the field of modern mobile communication applications that make use of compact, high-frequency equipment. Continued improvements in the performance characteristics of this equipment has over the years been achieved, further improvements will place continued emphasis on lowering the power consumption of the equipment, on reducing the size of the equipment, on increasing the operational frequency of the applications and on creating low noise levels. One of the main applications of semiconductor devices in the field of mobile communication is the creation of Radio Frequency (RF) amplifiers. RF amplifiers contain a number of standard components, a major component of a typical RF amplifier is a tuned circuit that contains inductive and capacitive components. Tuned circuits form, dependent on and determined by the values of their inductive and capacitive components, an impedance that is frequency dependent, enabling the tuned circuit to either present a high or a low impedance for signals of a certain frequency. The tuned circuit can therefore either reject or pass and further amplify components of an analog signal, based on the frequency of that component. The tuned circuit can in this manner be used as a filter to filter out or remove signals of certain frequencies or to remove noise from a circuit configuration that is aimed at processing analog signals. The tuned circuit can also be used to form a high electrical impedance by using the LC resonance of the circuit and to thereby counteract the effects of parasitic capacitances that are part of a circuit. One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate.

At high frequencies, the electromagnetic field that is generated by the inductor induces eddy currents in the underlying silicon substrate. Since the silicon substrate is a resistive conductor, the eddy currents will consume electromagnetic energy resulting in significant energy loss, resulting in a low Q capacitor. This is the main reason for a low Q value of a capacitor, whereby the resonant frequency of $1/\sqrt{(LC)}$ limits the upper boundary of the frequency. In addition, the eddy currents that are induced by the inductor will interfere with the performance of circuitry that is in close physical proximity to the capacitor.

It has already been pointed out that one of the key components that are used in creating high frequency analog semiconductor devices is the inductor that forms part of an LC resonance circuit. In view of the high device density that is typically encountered in semiconductor devices and the therefrom following intense use of the substrate surface area, the creation of the inductor must incorporate the minimization of the surface area that is required for the inductor, while at the same time maintaining a high Q value for the inductor. Typically, inductors that are created on the surface of a substrate are of a spiral shape whereby the spiral is created in a plane that is parallel with the plane of the surface of the substrate. Conventional methods that are used to create the inductor on the surface of a substrate suffer several limitations. Most high Q inductors form part of a hybrid device configuration or of Monolithic Microwave Integrated Circuits (MMIC's) or are created as discrete components, the creation of which is not readily integratable into a typical process of Integrated Circuit manufacturing. It is clear that, by combining the creation on one semiconductor monolithic substrate of circuitry that is aimed at the functions of analog data manipulation and analog data storage with the functions of digital data manipulation and digital data storage, a number of significant advantages can be achieved. Such advantages include the reduction of manufacturing costs and the reduction of power consumption by the combined functions. The spiral form of the inductor that is created on the surface of a semiconductor substrate however results, due to the physical size of the inductor, in parasitic capacitances between the inductor wiring and the underlying substrate and causes electromagnetic energy losses in the underlying resistive silicon substrate. These parasitic capacitances have a serious negative effect on the functionality of the created LC circuit by sharply reducing the frequency of resonance of the tuned circuit of the application. More seriously, the inductor-generated electromagnetic field will induce eddy currents in the underlying resistive silicon substrate, causing a significant energy loss that results in low Q inductors.

The performance parameter of an inductor is typically indicated is the Quality (O) factor of the inductor. The quality factor Q of an inductor is defined as $Q=E_s/E_l$, wherein Es is the energy that is stored in the reactive portion of the component while El is the energy that is lost in the reactive portion of the component. The higher the quality of the component, the closer the resistive value of the component approaches zero while the Q factor of the component approaches infinity. For inductors that are created overlying a silicon substrate, the electromagnetic energy that is created by the inductor will primarily be lost in the resistive silicon of the underlying substrate and in the metal lines that are created to form the inductor. The quality factor for components differs from the quality that is associated with filters or resonators. For components, the quality factor serves as a measure of the purity of the reactance (or the susceptance) of the component, which can be degraded due to the resistive silicon substrate, the resistance of the metal lines and dielectric losses. In an actual configuration, there are always some physical resistors that will dissipate power, thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit the upper bound of the cut-off frequency that can be achieved for the inductor using conventional silicon processes. This limitation is, for many applications, not acceptable. Dependent on the frequency at which the LC circuit is designed to resonate, significantly larger values of quality factor, such as for instance 50 or more, must be available. Prior Art has in this been limited to creating values of higher quality factors as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly, thereby again introducing additional parasitic capacitances and resistive losses over the interconnecting wiring network. For many of the applications of a RF amplifier, such as portable battery powered applications, power consumption is at a premium and must therefore be as low as possible. By raising the power consumption, the effects of parasitic capacitances and resistive power loss can be partially compensated, but there are limitations to even this approach. These problems take on even greater urgency with the rapid expansion of wireless applications, such as portable telephones and the like. Wireless communication is a rapidly expanding market, where the integration of RF integrated circuits is one of the most important challenges. One of the approaches is to significantly increase the frequency of operation to for instance the range of 10 to 100 GHz. For such high frequencies, the value of the quality factor obtained from silicon-based inductors is significantly degraded. For applications in this frequency range, monolithic inductors have been researched using other than silicon as the base for the creation of the inductors. Such monolithic inductors have for instance been created using sapphire or GaAs as a base. These inductors have considerably lower substrate losses than their silicon counterparts (no eddy current, hence no loss of electromagnetic energy) and therefore provide much higher Q inductors. Furthermore, they have lower parasitic capacitance and therefore provide higher frequency operation capabilities. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed. It is known that GaAs is a semi-insulating material at high frequencies, reducing the electromagnetic losses that are incurred in the surface of the GaAs substrate, thereby increasing the Q value of the inductor created on the GaAs surface. GaAs RF chips however are expensive, a process that can avoid the use of GaAs RF chips therefore offers the benefit of cost advantage.

A number of different approaches have been used to incorporate inductors into a semiconductor environment without sacrificing device performance due to substrate losses. One of these approaches has been to selectively remove (by etching) the silicon underneath the inductor (using methods of micro machining), thereby removing substrate resistive energy losses and parasitic effects. Another method has been to use multiple layers of metal (such as aluminum) interconnects or of copper damascene interconnects.

Other approaches have used a high resistivity silicon substrate thereby reducing resistive losses in the silicon substrate. Resistive substrate losses in the surface of the underlying substrate form a dominant factor in determining the Q value of silicon inductors. Further, biased wells have been proposed underneath a spiral conductor, this again aimed at reducing inductive losses in the surface of the substrate. A more complex approach has been to create an active inductive component that simulates the electrical properties of an inductor as it is applied in active circuitry. This latter approach however results in high power consumption by the simulated inductor and in noise performance that is unacceptable for low power, high frequency applications. All of these approaches have as common objectives to enhance the quality (Q) value of the inductor and to reduce the surface area that is required for the creation of the inductor. The most important consideration in this respect is the electromagnetic energy losses due to the electromagnetic induced eddy currents in the silicon substrate.

When the dimensions of Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

Current techniques for building an inductor on the surface of a semiconductor substrate use fine-line techniques whereby the inductor is created under a layer of passivation. This however implies close physical proximity between the created inductor and the surface of the substrate over which the inductor has been created (typically less than 10 μm), resulting in high electromagnetic losses in the silicon substrate which in turn results in reducing the Q value of the inductor. By increasing the distance between the inductor and the semiconductor surface, the electromagnetic field in the silicon substrate will be reduced in reverse proportion to the distance, the Q value of the inductor can be increased. By therefore creating the inductor overlying the layer of passivation (by a post passivation process) and by, in addition, creating the inductor on the surface of a thick layer of dielectric (such as a polymer) that is deposited or adhered over the surface of a layer of passivation, the Q value of the inductor can be increased. In addition, by using wide and thick metal for the creation of the inductor, the parasitic resistance is reduced. The process of the invention applies these principles of post passivation inductor creation while the inductor is created on a thick layer of dielectric using thick and wide metals.

U.S. Pat. No. 5,212,403 (Nakanishi) shows a method of forming wiring connections both inside and outside (in a wiring substrate over the chip) for a logic circuit depending on the length of the wire connections.

U.S. Pat. No. 5,501,006 (Gehman, Jr. et al.,) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip. However, this reference differs from the invention.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and I/0 traces.

U.S. Pat. No. 6,008,102 (Alford et al.) shows a helix inductor using two metal layers connected by vias.

U.S. Pat. No. 5,372,967 (Sundaram et al.) discloses a helix inductor.

U.S. 5'576,680 (Ling) and U.S. Pat. No. 5,884,990 (Burghartz et al.) show other helix inductor designs.

SUMMARY OF THE INVENTION

It is the primary objective of the invention to improve the RF performance of High Performance Integrated Circuits.

Another objective of the invention is to provide a method for the creation of a high-Q inductor.

Another objective of the invention is to replace the GaAs chip with a silicon chip as a base on which a high-Q inductor is created.

Yet another objective of the invention is to extend the frequency range of the inductor that is created on the surface of a silicon substrate.

It is yet another objective of the invention to create high quality passive electrical components overlying the surface of a silicon substrate.

The above referenced continuation-in-part application adds, in a post passivation processing sequence, a thick layer of dielectric over a layer of passivation and layers of wide and thick metal lines on top of the thick layer of dielectric. The present invention extends the above referenced continuation-in-part application by in addition creating high quality electrical components, such as an inductor, a capacitor or a resistor, on a layer of passivation or on the surface of a thick layer of dielectric. In addition, the process of the invention provides a method for mounting discrete passive electrical components at a significant distance removed from the underlying silicon surface.

DESCRIPTION OF THE PREFERRED EMBODIMENTS

The referenced continuation-in-part application teaches an Integrated Circuit structure where re-distribution and interconnect metal layers are created in layers of dielectric on the surface of a conventional IC. A layer of passivation is deposited over the dielectric of the re-distribution and interconnection metal layers, a thick layer of polymer is deposited over the surface of the layer of passivation. Under the present invention, a high-quality electrical component is created on the surface of the thick layer of polymer.

The invention addresses, among others, the creation of an inductor whereby the emphasis is on creating an inductor of high Q value on the surface of a semiconductor substrate using methods and procedures that are well known in the art for the creation of semiconductor devices. The high quality of the inductor of the invention allows for the use of this inductor in high frequency applications while incurring minimum loss of power. The invention further addresses the creation of a capacitor and a resistor on the surface of a silicon substrate whereby the main objective (of the process of creating a capacitor and resistor) is to reduce parasitics that are typically incurred by these components in the underlying silicon substrate.

Figure 1:
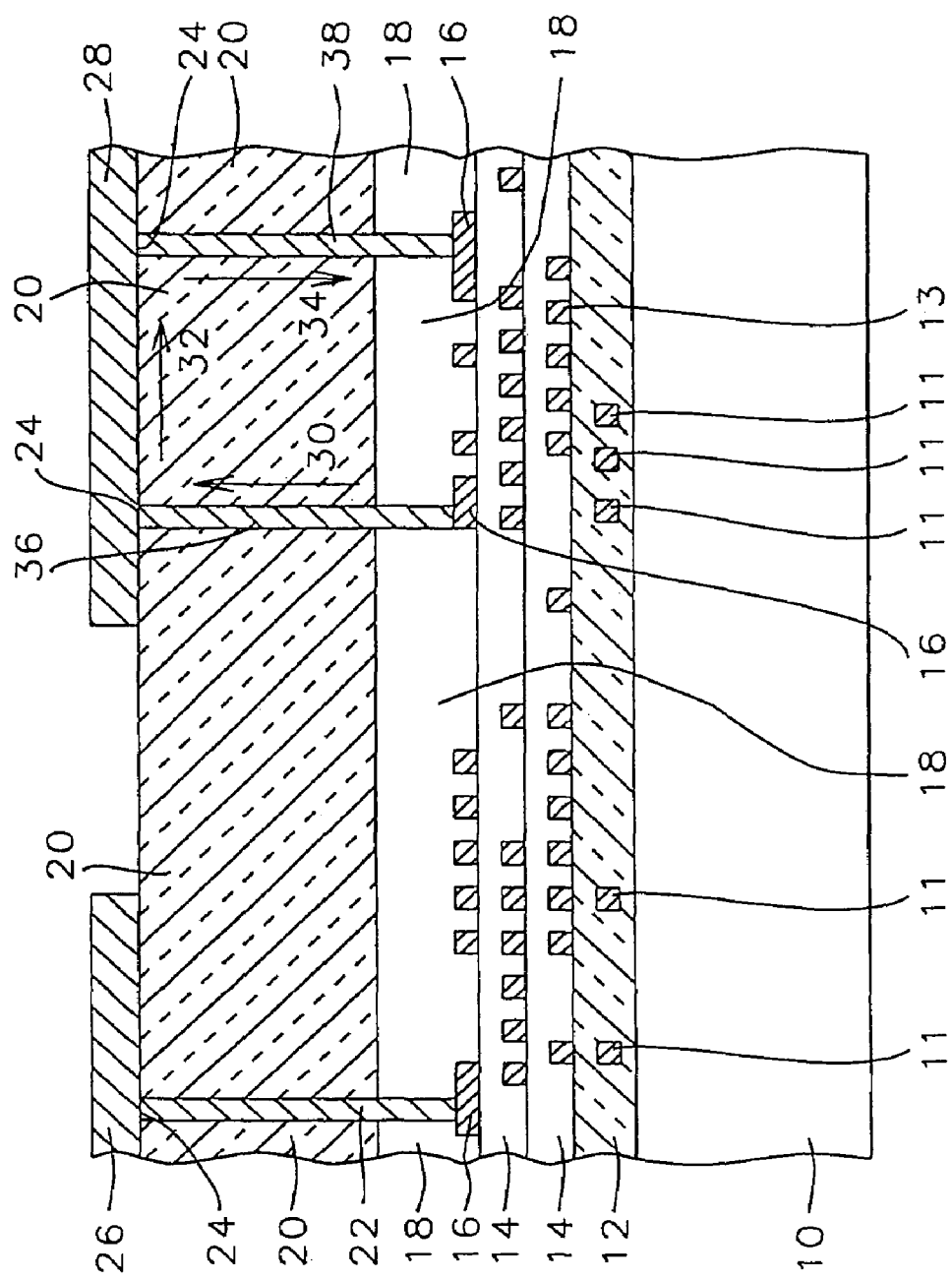
FIG. 1 shows a cross section of the interconnection scheme of the referenced continuation-in-part application invention.

Referring now more specifically to FIG. 1, there is shown a cross section of one implementation of the referenced application. The surface of silicon substrate 10 has been provided with transistors and other devices (not shown in FIG. 1). The surface of substrate 10 is covered by a dielectric layer 12, layer 12 of dielectric is therefore deposited over the devices that have been provided in the surface of the substrate and over the substrate 10. Conductive interconnect lines 11 are provided inside layer 12 that connect to the semiconductor devices that have been provided in the surface of substrate 10.

Layers 14 (two examples are shown) represent all of the metal layers and dielectric layers that are typically created on top of the dielectric layer 12, layers 14 that are shown in FIG. 1 may therefore contain multiple layers of dielectric or insulation and the like, conductive interconnect lines 13 make up the network of electrical connections that are created throughout layers 14. Overlying and on the surface of layers 14 are points 16 of electrical contact. These points 16 of electrical contact can for instance be bond pads that establish the electrical interconnects to the transistors and other devices that have been provided in the surface of the substrate 10. These points of contact 16 are points of interconnect within the IC arrangement that need to be further connected to surrounding circuitry. A passivation layer 18, formed of for example silicon nitride, is deposited over the surface of layers 14 to protect underlying layers from moisture, contamination, etc.

The key steps of the above referenced application begin with the deposition of a thick layer 20 of polyimide that is deposited over the surface of layer 18. Access must be provided to points of electrical contact 16, for this reason a pattern of openings 22, 36 and 38 is etched through the polyimide layer 20 and the passivation layer 18, the pattern of openings 22, 36 and 38 aligns with the pattern of electrical contact points 16. Contact points 16 are, by means of the openings 22/36/38 that are created in the layer 20 of polyimide, electrically extended to the surface of layer 20.

The above referenced material that is used for the deposition of layer 20 is polyimide, the material that can be used for this layer is not limited to polyimide but can contain any of the known polymers ($SiCl_xO_y$). The indicated polyimide is the preferred material to be used for the processes of the invention for the thick layer 20 of polymer. Examples of polymers that can be used are silicons, carbons, fluoride, chlorides, oxygens, parylene or teflon, polycarbonate (PC), polysterene (PS), polyoxide (PO), poly polooxide (PPO), benzocyclobutene (BCB).

Electrical contact with the contact points 16 can now be established by filling the openings 22/36/38 with a conductive material. The top surfaces 24 of these metal conductors that are contained in openings 22/36/38 can now be used for connection of the IC to its environment, and for further integration into the surrounding electrical circuitry. This latter statement is the same as saying that semiconductor devices that have been provided in the surface of substrate 10 can, via the conductive interconnects contained in openings 22/36/38, be further connected to surrounding components and circuitry. Interconnect pads 26 and 28 are formed on top of surfaces 24 of the metal interconnects contained in openings 22, 36 and 38. These pads 26 and 28 can be of any design in width and thickness to accommodate specific circuit design requirements. A pad can, for instance, be used as a flip chip pad. Other pads can be used for power distribution or as a ground or signal bus. The following connections can, for instance, be made to the pads shown in FIG. 1: pad 26 can serve as a flip chip pad, pad 28 can serve as a flip chip pad or can be connected to electrical power or to electrical ground or to an electrical signal bus. There is no relation between the size of the pads shown in FIG. 1 and the suggested possible electrical connections for which this pad can be used. Pad size and the standard rules and restrictions of electrical circuit design determine the electrical connections to which a given pad lends itself.

The following comments relate to the size and the number of the contact points 16, FIG. 1. Because these contact points 16 are located on top of a thin dielectric (layers 14, FIG. 1) the pad size cannot be too large since a large pad size brings with it a large capacitance. In addition, a large pad size will interfere with the routing capability of that layer of metal. It is therefore preferred to keep the size of the pad 16 relatively small. The size of pad 16 is however also directly related with the aspect ratio of vias 22/36/38. An aspect ratio of about 5 is acceptable for the consideration of via etching and via filling. Based on these considerations, the size of the contact pad 16 can be in the order of 0.5 μm to 30 μm, the exact size being dependent on the thickness of layers 18 and 20.

The referenced application does not impose a limitation on the number of contact pads that can be included in the design, this number is dependent on package design requirements. Layer 18 in FIG. 1 can be a typical IC passivation layer.

The most frequently used passivation layer in the present state of the art is plasma enhanced CVD (PECVD) oxide and nitride. In creating layer 18 of passivation, a layer of approximately 0.2 μm PECVD oxide can be deposited first followed by a layer of approximately 0.7 μm nitride. Passivation layer 18 is very important because it protects the device wafer from moisture and foreign ion contamination. The positioning of this layer between the sub-micron process (of the integrated circuit) and the tens-micron process (of the interconnecting metalization structure) is of critical importance since it allows for a cheaper process that possibly has less stringent clean room requirements for the process of creating the interconnecting metalization structure.

Layer 20 is a thick polymer dielectric layer (for example polyimide) that have a thickness in excess of 2 μm (after curing). The range of the polymer thickness can vary from 2 μm to 150 μm, dependent on electrical design requirements.

For the deposition of layer 20 the Hitachi-Dupont polyimide HD 2732 or 2734 can, for example, be used. The polyimide can be spin-on coated and cured. After spin-on coating, the polyimide will be cured at 400 degrees C. for about 1 hour in a vacuum or nitrogen ambient. For a thicker layer of polyimide, the polyimide film can be multiple coated and cured.

Another material that can be used to create layer 20 is the polymer benzocyclobutene (BCB). This polymer is at this time commercially produced by for instance Dow Chemical and has recently gained acceptance to be used instead of typical polyimide application.

The dimensions of openings 22, 36 and 38 have previously been discussed. The dimension of the openings together with the dielectric thickness determine the aspect ratio of the opening. The aspect ratio challenges the via etch process and the metal filling capability. This leads to a diameter for openings 22/36/38 in the range of approximately 0.5 μm to 30 μm, the height for openings 22/36/38 can be in the range of approximately 2 μm to 150 μm. The aspect ratio of openings 22/36/38 is designed such that filling of the via with metal can be accomplished. The via can be filled with CVD metal such as CVD tungsten or CVD copper, with electro-less nickel, with a damascene metal filling process, with electroplating copper, etc.

The referenced application can be further extended by applying multiple layers of polymer (such as polyimide) and can therefore be adapted to a larger variety of applications. The function of the structure that has been described in FIG. 1 can be further extended by depositing a second layer of polyimide on top of the previously deposited layer 20 and overlaying the pads 26 and 28. Selective etching and metal deposition can further create additional contact points on the surface of the second layer of polyimide that can be interconnected with pads 26 and 28. Additional layers of polyimide and the thereon created contact pads can be customized to a particular application, the indicated extension of multiple layers of polyimides greatly enhances the flexibility and usefulness of the referenced continuation-in-part application.

FIG. 1 shows a basic design advantage of the referenced continuation-in-part application. This advantage allows for sub-micron or fine-lines, that run in the immediate vicinity of the metal layers 14 and the contact points 16, to be extended in an upward direction 30 through metal interconnect 36. This extension continues in the direction 32 in the horizontal plane of the metal interconnect 28 and comes back down in the downward direction 34 through metal interconnect 38. The functions and constructs of the passivation layer 18 and the insulating layer 20 remain as previously highlighted. This basic design advantage of the invention is to "elevate" or "fan-out" the fine-line interconnects and to remove these interconnects from the micro and sub-micro level to a metal interconnect level that has considerably larger dimensions and that therefore has smaller resistance and capacitance and is easier and more cost effective to manufacture. This aspect of the referenced application does not include any aspect of conducting line re-distribution and therefore has an inherent quality of simplicity. It therefore further adds to the importance of the referenced application in that it makes micro and sub-micro wiring accessible at a wide and thick metal level. The interconnections 20, 36 and 38 interconnect the fine-level metal by going up through the passivation and polymer or polyimide dielectric layers, continuing over a distance on the wide and thick metal level and continuing by descending from the wide and thick metal level back down to the fine-metal level by again passing down through the passivation and polymer or polyimide dielectric layers. The extensions that are in this manner accomplished need not be limited to extending fine-metal interconnect points 16 of any particular type, such as signal or power or ground, with wide and thick metal line 26 and 28. The laws of physics and electronics will impose limitations, if any, as to what type of interconnect can by established in this manner, limiting factors will be the conventional electrical limiting factors of resistance, propagation delay, RC constants and others. Where the referenced application is of importance is that the referenced continuation-in-part application provides much broader latitude in being able to apply these laws and, in so doing, provides a considerably extended scope of the application and use of Integrated Circuits and the adaptation of these circuits to a wide and thick metal environment.

Figure 2:
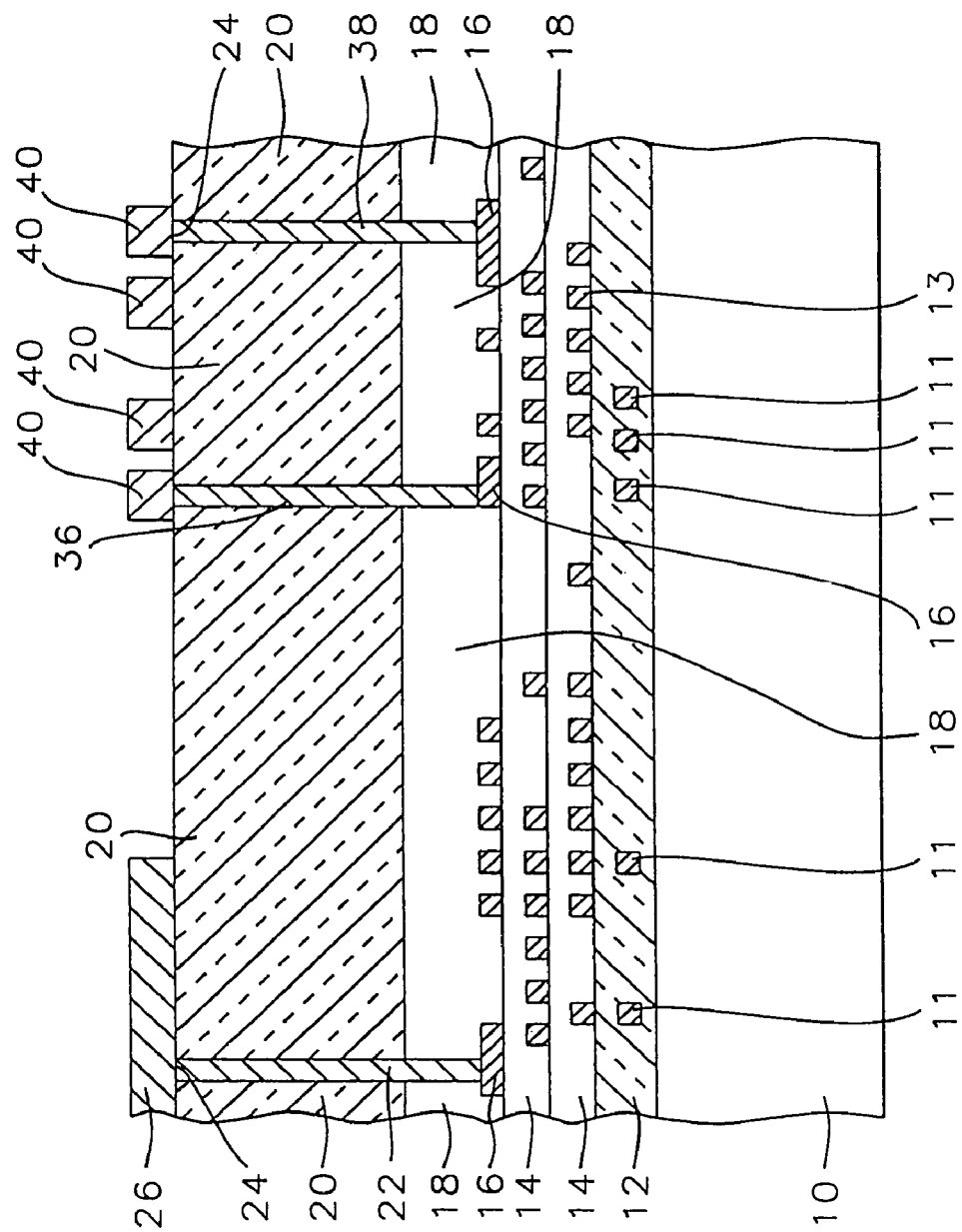
FIG. 2 shows a cross section of an extension of the referenced continuation-in-part application whereby an inductor has been created on the surface of a thick layer of polyimide.

FIG. 2 shows how the basic interconnect aspect of the referenced continuation-in-part application can further be extended under the present invention to not only elevate the fine-metal to the plane of the wide and thick metal but to also add an inductor on the surface of the thick layer 20 of polyimide. The inductor is created in a plane that is parallel with the surface of the substrate 10 whereby this plane however is separated from the surface of the substrate 10 by the combined heights of layers 12, 14, 18, and 20. FIG. 2 shows a cross section 40 of the inductor taken in a plane that is perpendicular to the surface of substrate 10. The wide and thick metal will also contribute to a reduction of the resistive energy losses. Furthermore, the low resistivity metal, such as gold, silver and copper, can be applied using electroplating, the thickness can be about 20 μm.

Figure 3:
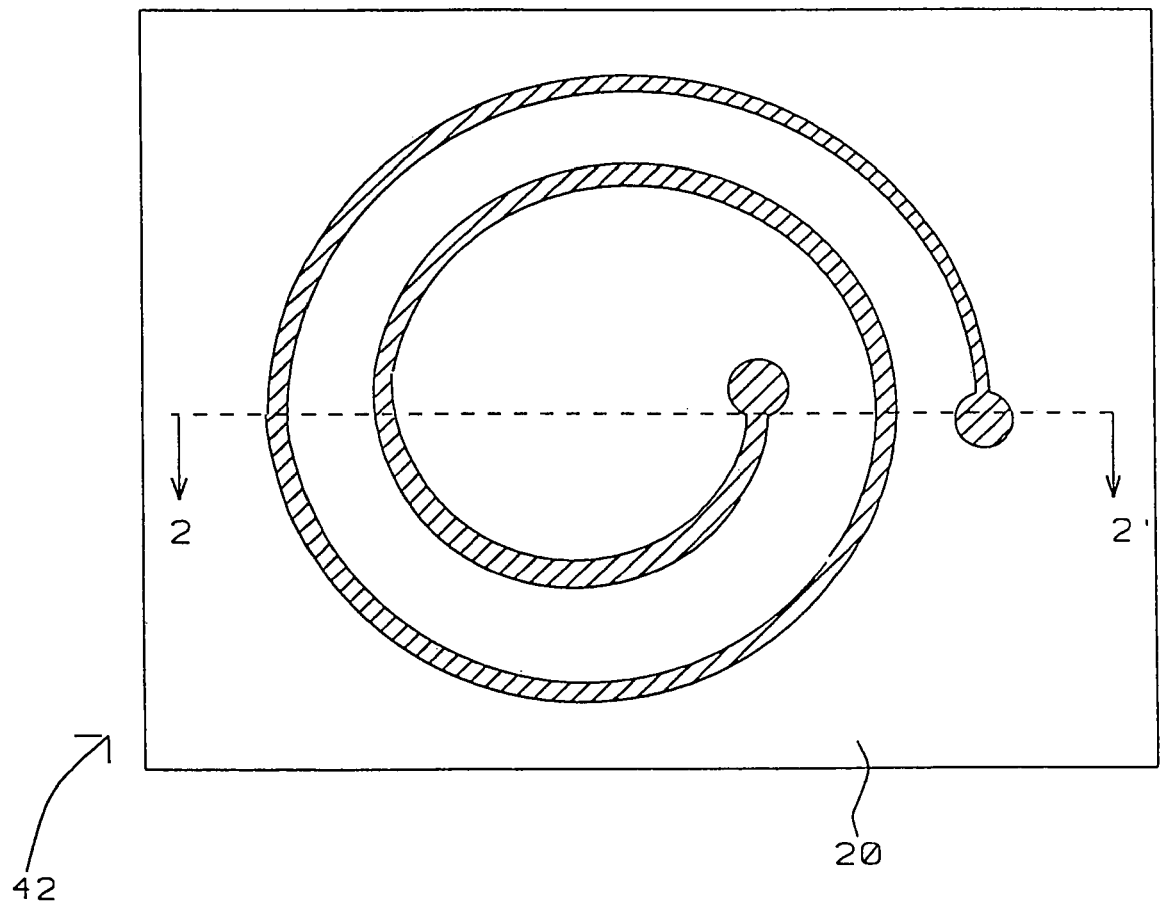
FIG. 3 shows a top view of an inductor that is created following the process of the invention.

FIG. 3 shows a top view 42 of the spiral structure of the inductor 40 that has been created on the surface of layer 20 of dielectric. The cross section that is shown in FIG. 2 of the inductor 40 has been taken along the line 2-2' of FIG. 3. The method used for the creation of the inductor 40 uses conventional methods of metal, such as gold, copper and the like, deposition by electroplating or metal sputter processes.

Figure 4:
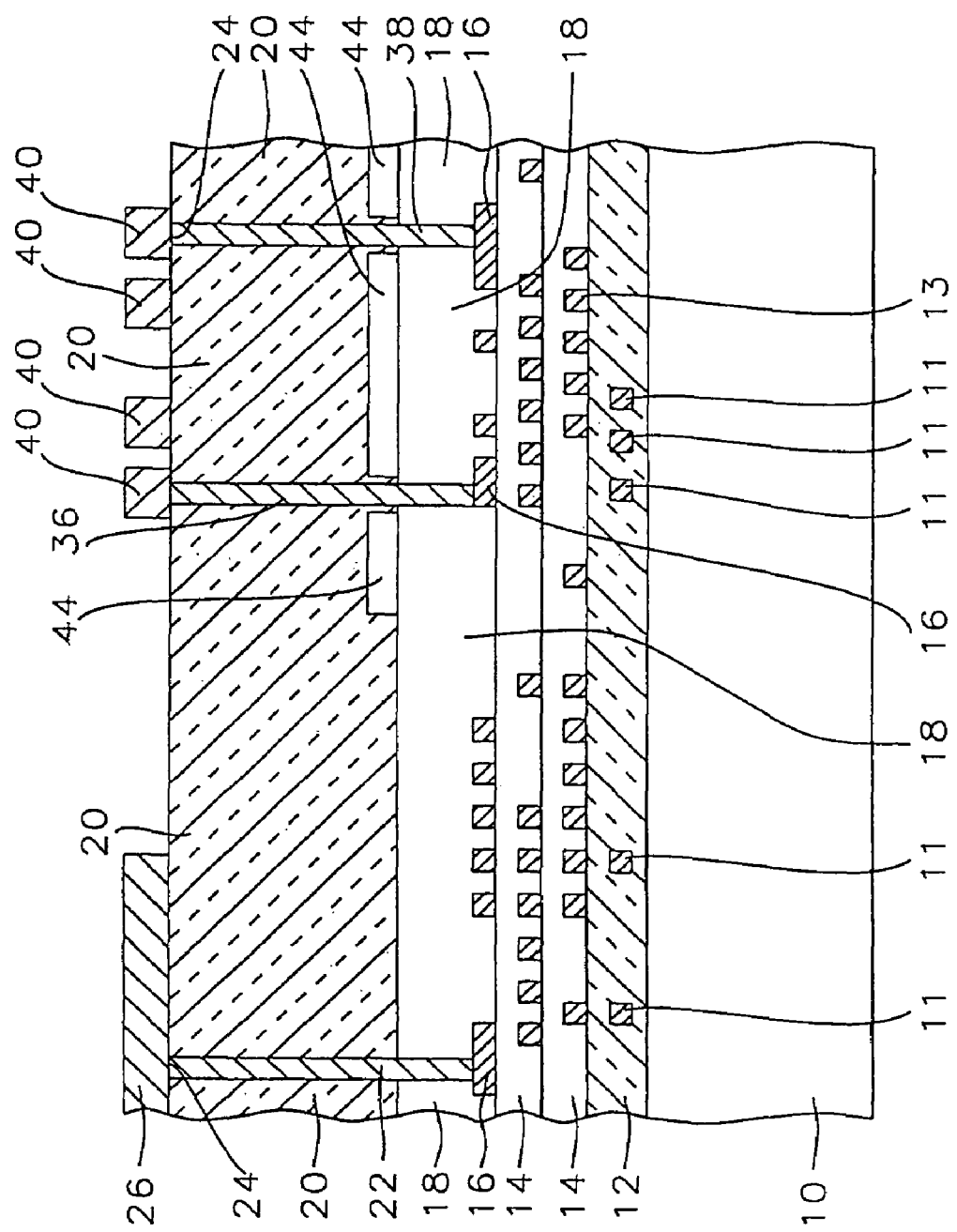
FIG. 4 shows a cross section of a substrate and overlying layers, an inductor has been created on the surface of a thick layer of polyimide, a layer of ferromagnetic material has been added to further insulate the inductor from the underlying silicon substrate.

FIG. 4 shows a top view of inductor 40 whereby the inductor has been further isolated from the surface of the substrate 10 by the addition of layer 44 of ferromagnetic material. Openings are created in layer 44 of ferromagnetic material for the conductors 36 and 38, the layer 44 is deposited using conventional methods to a thickness that can be experimentally determined and that is influenced by and partially dependent on the types of materials used and the thickness of the layers that are used overlying the ferromagnetic material (such as layer 20) for the creation of the structure that is shown in cross section in FIG. 4. The surface area of the ferromagnetic layer 44 typically extends over the surface of layer 18 such that the inductor 40 aligns with and overlays the layer 44, the surface area of layer 44 can be extended slightly beyond these boundaries to further improve shielding the surface of substrate 10 from the electromagnetic field of inductor 40.

Layer 44 is not limited to being a layer of ferromagnetic material but can also be a layer of a good conductor such as but not limited to gold, copper and aluminum. The overlying inductor 40 that is created on the surface of layer 20 of polyimide can be isolated from the underlying silicon substrate 10 by a layer 44 that comprises either ferromagnetic or a good conductor.

Figure 5A:
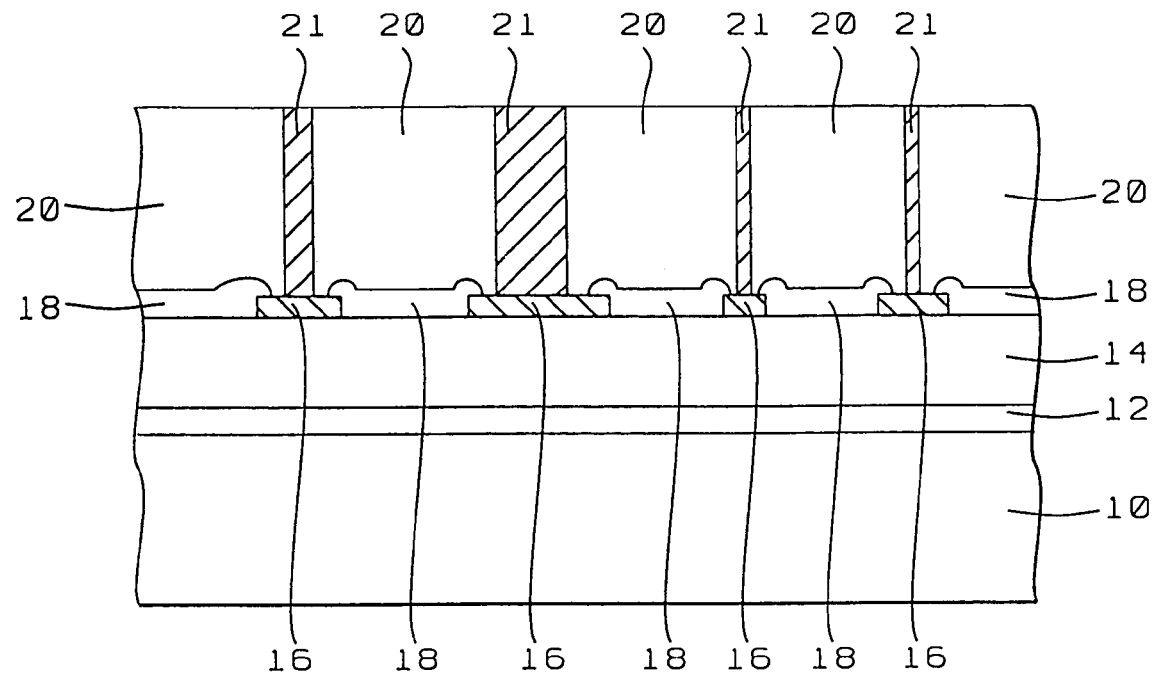
FIG. 5a shows a cross section of a simplified version of the substrate and the layers that are created on the surface of the substrate using the processes of the referenced continuation-in-part application.

FIG. 5*a* shows, for reasons of clarity, a simplified cross section of the substrate and the layers that are created on the surface of the substrate under the processes of the invention, the highlighted areas that are shown have previously been identified as:

10, the silicon substrate
  12, a layer of dielectric that has been deposited over the surface of the substrate
  14, an interconnect layer that contains interconnect lines, vias and contact points 16, contact points on the surface of the interconnect layer 14
18, a layer of passivation into which openings have been created through which the contact points 16 can be accessed
20, a thick layer of polymer, and
21, conductive plugs that have been provided through the layer 20 of polyimide.

The thick layer 20 of polymer can be coated in liquid form on the surface of the layer 18 of passivation or can be laminated over the surface of layer 18 of passivation by dry film application. Vias that are required for the creation of conductive plugs 21 can be defined by conventional processes of photolithography or can be created using laser (drill) technology.

It is clear from previous discussions that the sequence of layers that is shown in cross section in FIG. 5a has been created so that additional electrical components such as an inductor, a capacitor and the like can be created on the surface of layer 20 of polyimide and in electrical contact with conductive plugs 21. Layer 12 of dielectric may, in the cross section that is shown in FIG. 5a, be part of layer 14 since layer 14 is a layer of Intra Level Dielectric (ILD) within which layer 12 can be readily integrated.

Figure 5B:
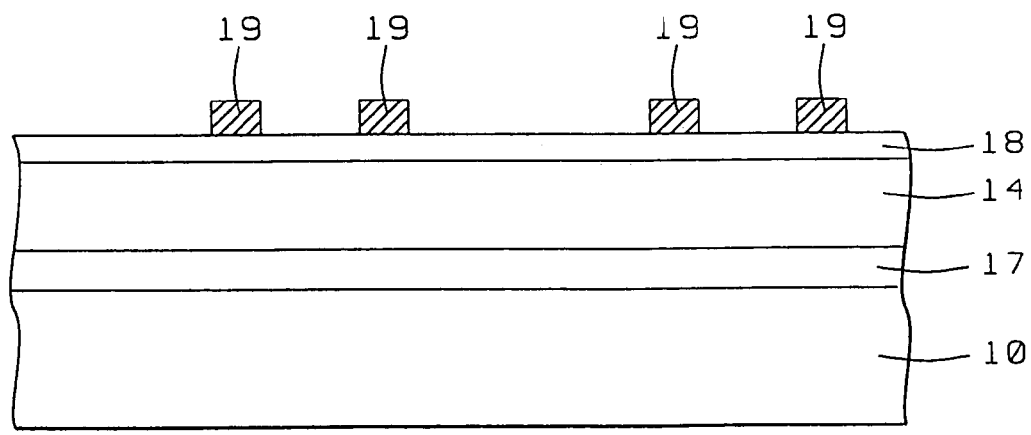
FIG. 5b shows the cross section of FIG. 5a, an inductor has been added above the layer of passivation.

With respect to the cross section that is shown in FIG. 5b, the same layers that have been identified for FIG. 5a are again provided in this cross section. Additionally has been shown the upper layer 17 of the silicon substrate 10 that contains active semiconductor devices. Also shown is the cross section of an inductor 19 that has been created on the surface of layer 18 of passivation. It must again be emphasized that the ohmic resistivity of the metal that is used for inductor 19 must be as low as possible. For this reason, the use of a thick layer of for instance gold is preferred for the formation of inductor 19. It has been shown that a thick layer of gold increased the Q value of inductor 19 from about 5 to about 20 for 2.4 GHz applications, which represents a significant improvement in the Q value of inductor 19.

Figure 6A:
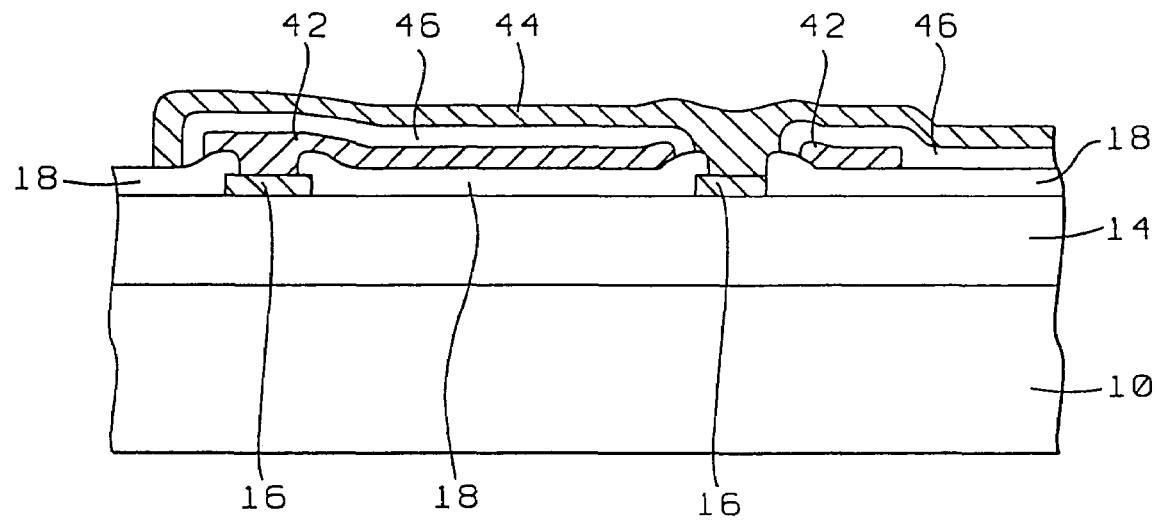
FIG. 6a shows a cross section of a substrate on the surface of which has been deposited a layer of passivation, a capacitor has been created on the surface of the layer of passivation.

FIG. 6a shows a cross section of a capacitor that has been created on the surface of a substrate 10. A layer 14 of conductive interconnect lines and contact points has been created on the surface of substrate 10. A layer 18 of passivation has been deposited over the surface of layer 14, openings have been created in layer 18 of passivation through which the surface of contact pads 16 can be accessed.

A capacitor contains, as is well known, a lower plate, an upper plate and a layer of dielectric that separates the upper plate from the lower plate. These components of a capacitor can be readily identified from the cross section that is shown in FIG. 6a, as follows:

42 is a conductive layer that forms the lower plate of the capacitor
44 is a conductive layer that forms the upper plate of the capacitor
46 is the dielectric layer that separates the upper plate 44 of the capacitor from the lower plate 42.

It must be noted from the cross section that is shown in FIG. 6a that the capacitor has been created on the surface of layer 18 of passivation, the process of creating the capacitor is therefore referred to as a post-passivation processing sequence. Processing conditions and materials that can be used for the creation of the respective layers 42, 44 and 46 have already been highlighted and need therefore not be further detailed at this time.

The main points of interest are the various thicknesses to which the three layers 42, 44 and 46 can be deposited, as follows:

layer 18 of passivation between about 0.1 μm and 0.3 μm
layer 42 of conductive material between about 0.5 and 20 μm
layer 44 of dielectric between about 500 and 10,000 Angstrom, and
layer 46 of conductive material between about 0.5 and 20 μm.

The post-passivation created capacitor that is shown in cross section in FIG. 6a has:

reduced parasitic capacitance between the capacitor and the underlying silicon substrate
allowed for the use of a thick layer of conductive material, reducing the resistance of the capacitor; this is particularly important for wireless applications
allowed for the use of high-dielectric material such as $TiO_2$, $Ta_2O_5$ for the dielectric between the upper and the lower plate of the capacitor, resulting in a higher capacitive value of the capacitor.

Figure 6B:
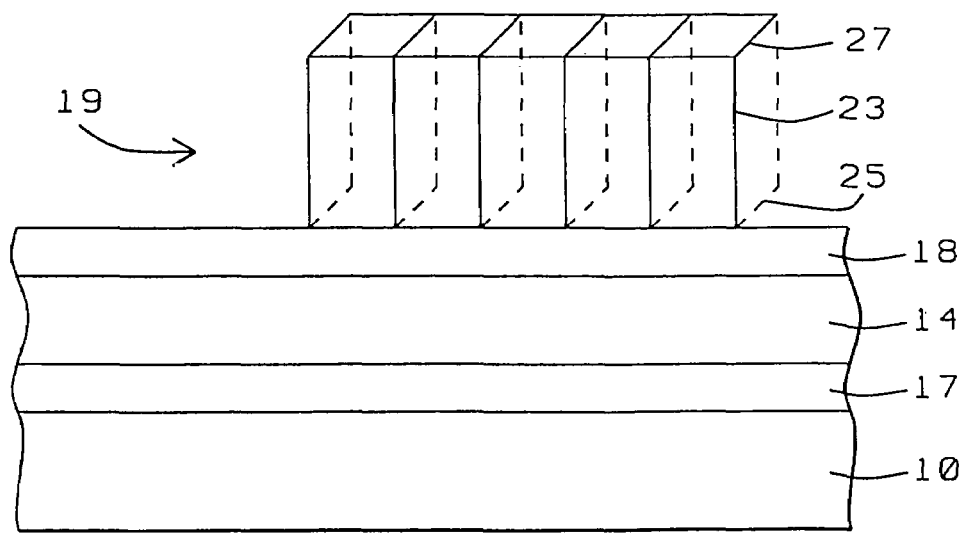
FIG. 6b shows a three dimensional view of an inductor that has been created on the surface of a layer of passivation by creating vias in a thick layer of polymer.

FIG. 6b shows a three-dimensional view of the solenoid structure of an inductor 19 that has been created on the surface of the layer 18 of passivation. Further highlighted in FIG. 6b are:

23, vias that are created in the thick layer of polymer 20, FIG. 5a, for the interconnects of the upper and the lower levels of metal of the inductor
25, the bottom metal of the inductor
27, the top metal for the inductor.

Figure 6C:
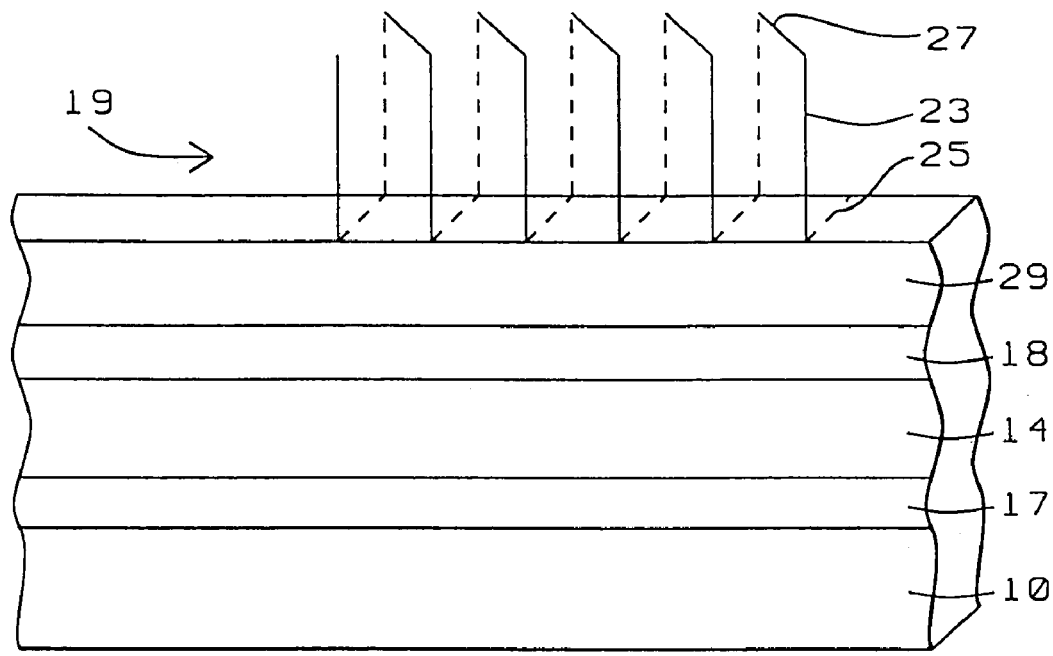
FIG. 6c shows a three-dimensional view of an inductor that has been created in a thick layer of polymer that has been deposited on the surface of a thick layer of polyimide.

FIG. 6c shows a three dimensional view of an inductor that has been created on the surface of a layer 18 of passivation by first depositing a thick layer 29 of polymer over which a layer (not shown) of polymer is deposited, vias 23 are created in the thick layer 20 (FIG. 5a) of polymer. In addition to the previously highlighted layers, FIG. 6c shows a layer 29 of polyimide. The inductor 19 is created by creating the bottom metal 25 of the inductor 19, the top metal 27 of the inductor and the vias 23 that are created in layer 20 (FIG. 5a) that preferably contains a polymer.

Figure 6D:
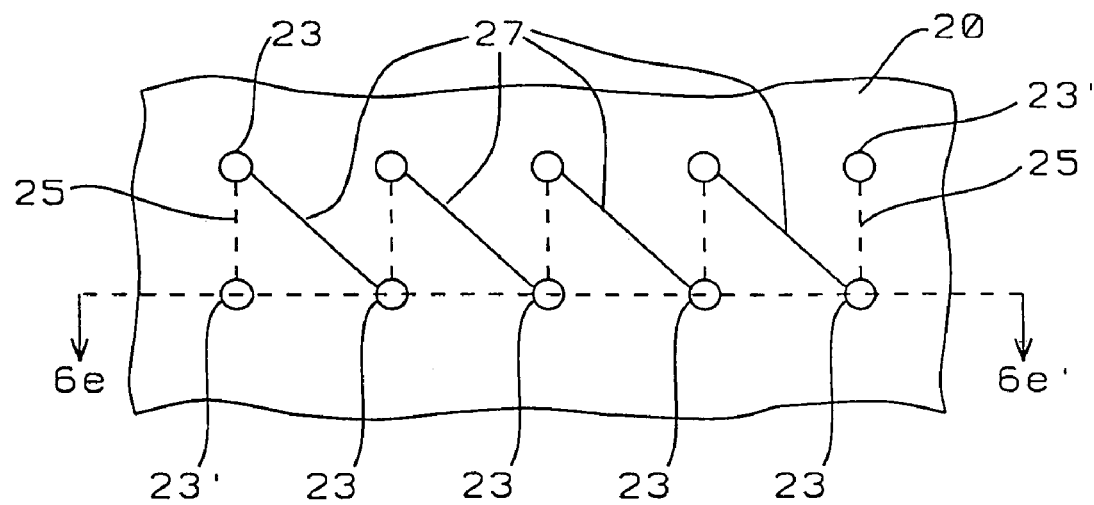
FIG. 6d shows a top view of the layer 20 on the surface of which an inductor has been created.

FIG. 6d shows a top view of layer 20 on the surface of which an inductor has been created as previously shown in FIG. 6c. Vias 23 are highlighted as are top metal lines 27 of the inductor 19, bottom metal lines 25 of the inductor 19 (hatched since they are not visible on the surface of the layer 20). Further detailed are vias 23' and 23", the lower extremity of via 23' and the upper extremity of via 23" are connected to interconnect lines 31 and 33 (FIG. 6e) respectively, theses interconnect lines 31 and 33 provide the connection for further interconnect of the inductor 19.

Figure 6E:
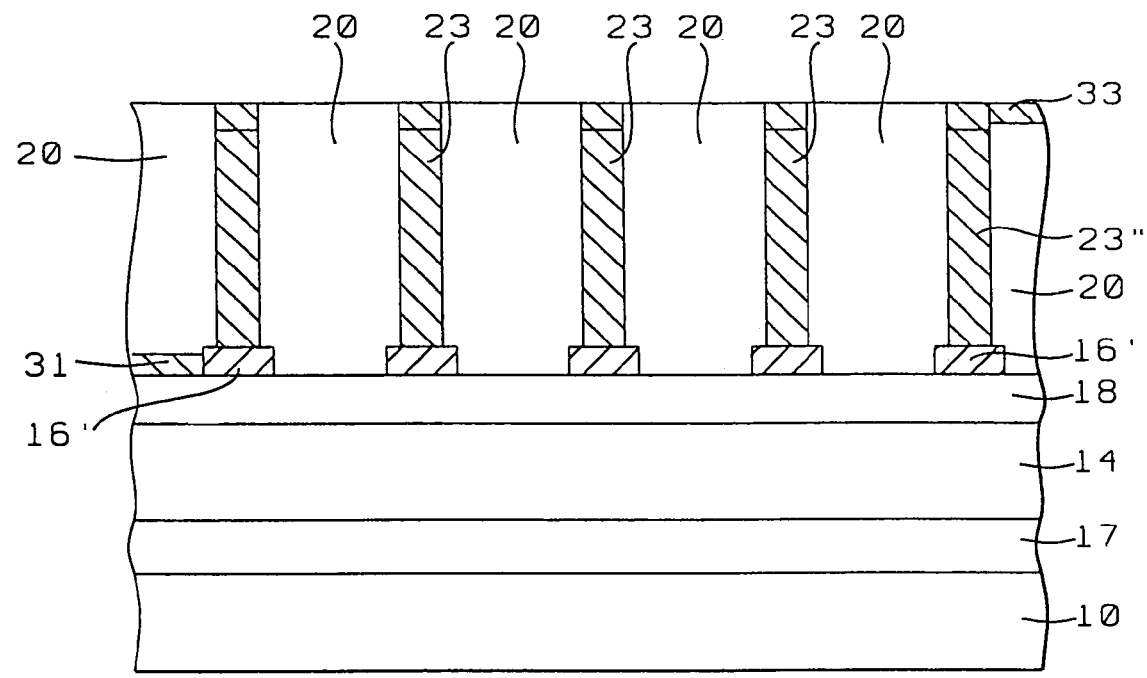
FIG. 6e shows a cross section of the structure of FIG. 6d taken along the line 6e-6e' of FIG. 6d.

FIG. 6e shows a cross section of the structure of FIG. 6d whereby this cross section is taken along the line 6e-6e' that is shown in FIG. 6d. Contact pads 16' have been provided on the surface of layer 18 of passivation, these contact pads 16' make contact with the vias 23, 23' and 23" for interconnection between the bottom metal 25 of inductor 19 and the upper metal 27 of the inductor 19. Interconnects to vias 23' and 23" are the lines 31 and 33 which, as previously stated, connect the inductor 19 to surrounding electrical circuitry or components.

Figure 6F:
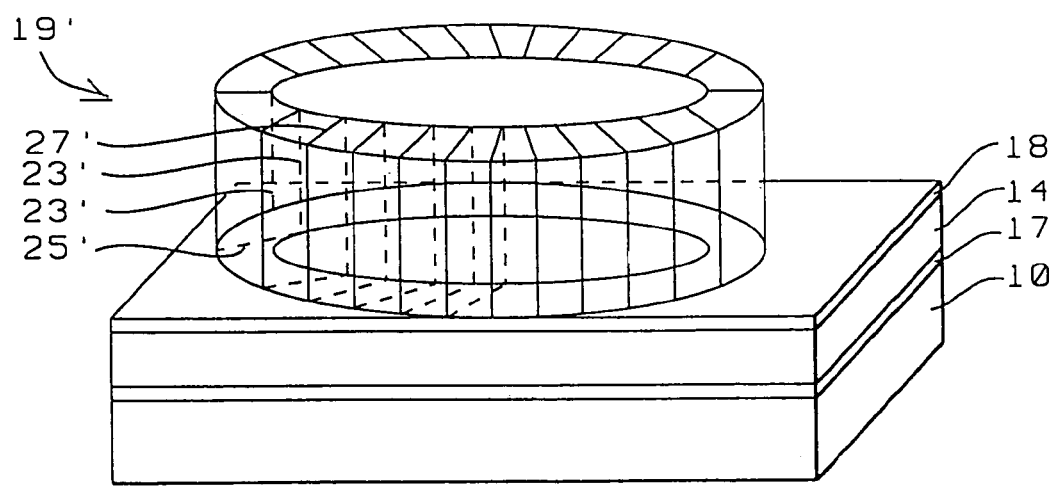
FIG. 6f shows a three dimensional view of an inductor that has been created on the surface of a layer of passivation, the inductor has the shape of a solenoid.
Figure 6G:
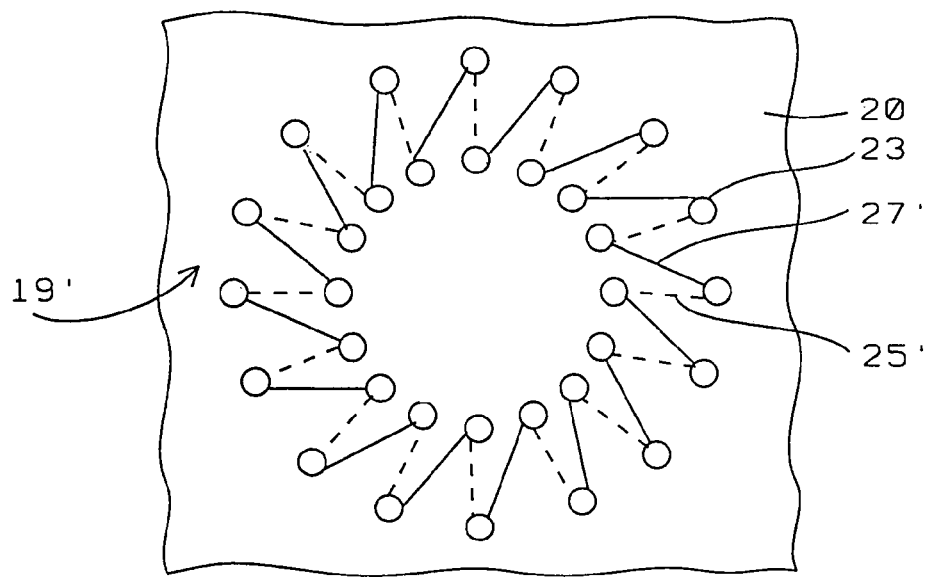
FIG. 6g shows a top view of the inductor of FIG. 6f.

The creation of a toroidal inductor overlying a layer of passivation has been shown in FIGS. 6f and 6g where toroidal coil 19' is created on the surface of a layer 18 of passivation. Top level metal 27', bottom level metal 25' and vias 23' that interconnect bottom level metal 25' with top level metal 27' have been highlighted in FIG. 6f.

FIG. 6g shows, for further clarification, a top view of the toroidal 19' of FIG. 6f. The highlighted features of this figure have previously been explained and therefore do not need to be further discussed at this time.

Figure 7:
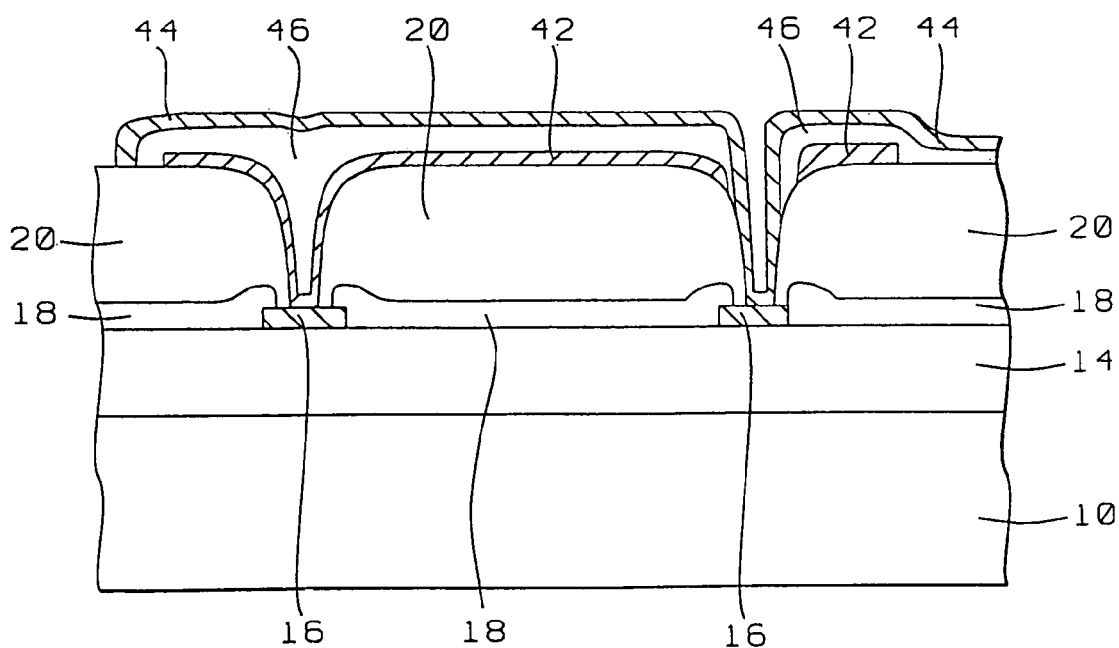
FIG. 7 shows a cross section of a substrate on the surface of which has been deposited a layer of passivation over which a thick layer of polyimide has been deposited, a capacitor has been created on the surface of the thick layer of polyimide.

FIG. 7 shows a cross section where, as in FIG. 6a, a capacitor is created on the surface of substrate 10. In the cross section that is shown in FIG. 7 however a thick layer 20 of polyimide has been deposited over the surface of the passivation layer 18 and has been patterned and etched in order to make the contact pads 16 accessible though the thick layer 20 of poly. The thick layer 20 of polymer removes most of the capacitor, that is the lower plate 42, the upper plate 44 and the dielectric 46, from the surface of substrate 10 by a distance that is equal to the thickness of layer 20. It has previously been state that the range of polyimide thickness can vary from 2 μm to 150 μm and is dependent on electrical design requirements. This statement is also valid for the cross section shown in FIG. 7, the layers of the capacitor can therefore be removed from the surface of substrate 10 by a distance of 2 μm to 150 μm. It is clear that this leads to a significant increase in distance between the capacitor and the underlying silicon substrate, the parasitic capacitance will therefore be significantly reduced.

Figure 8:
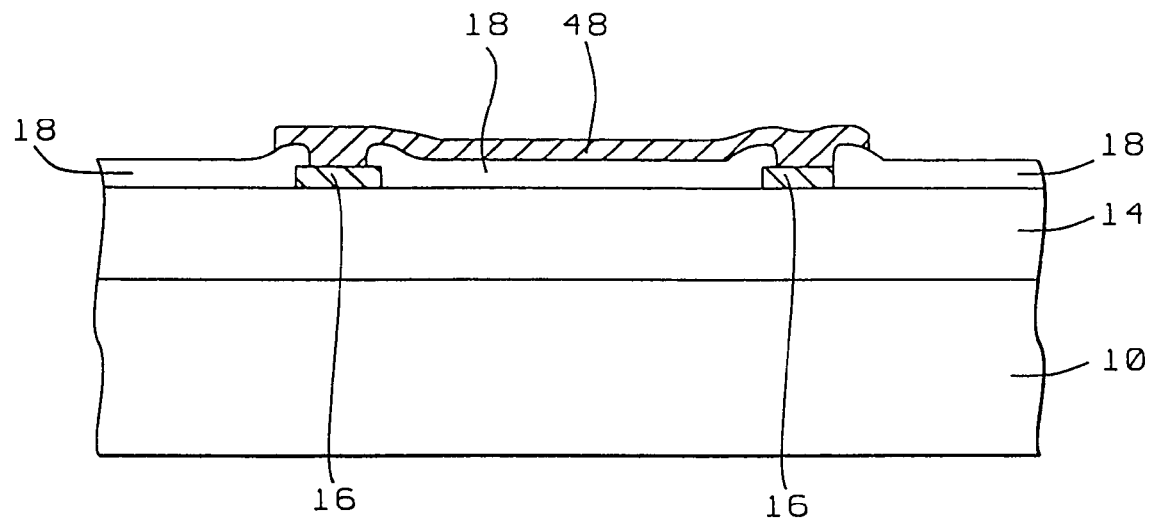
FIG. 8 shows a cross section of a substrate on the surface of which has been deposited a layer of passivation, a resistor has been created on the surface of the layer of passivation.

FIG. 8 shows a cross section of a substrate 10 on the surface of which has been deposited a layer 18 of passivation, a resistor 48 has been created on the surface of the layer 18 of passivation. A resistor, as is well known, is created by connecting two points with a material that offers electrical resistance to the passage of current through the material. The two points that are part of the resistance 48 that is shown in cross section in FIG. 8 are the contact pads 16 that have been created in or on the surface of the interconnect layer 14. By creating layer 48 between the two contact pads, that interconnects the two contact pads and that is deposited on the surface of passivation layer 18, a resistor has been created in accordance with the processes of the invention. For the creation of layer 48 a high resistivity material can be used such as TaN, silicon nitride, phosphosilicate glass (PSG), silicon oxynitride, aluminum, aluminum oxide ($Al_xO_y$), tantalum, nionbium, or molybdenum. It is clear that dimensions such as thickness, length and width of deposition of layer 48 of high resistivity material are application dependent and can therefore not be specified at this time in any detail. The resistor that is shown in cross section in FIG. 8 is, as are the capacitors of FIGS. 6a and 7, created in a post-passivation process on the surface of layer 18 of passivation.

Figure 9:
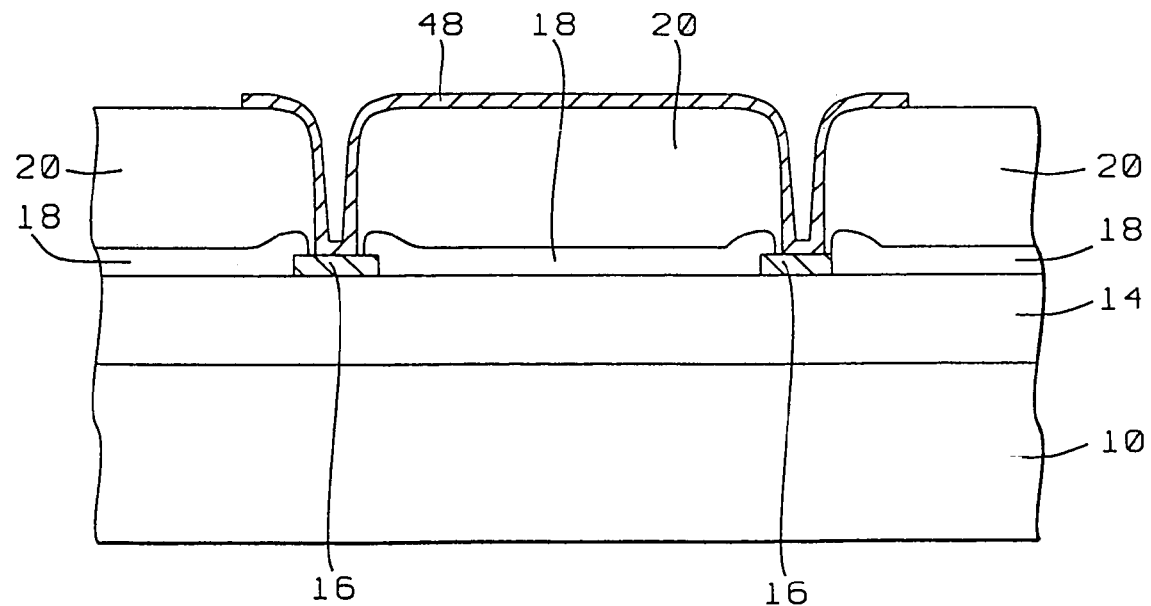
FIG. 9 shows a cross section of a substrate on the surface of which has been deposited a layer of passivation over which a thick layer of polyimide has been deposited, a resistor has been created on the surface of the thick layer of polyimide.

FIG. 9 shows a cross section of a substrate 10, an interconnect layer 14 has been created on the surface of the substrate. A layer 18 of passivation has been deposited over the layer 14 of interconnect metal, a thick layer 20 of polyimide has been deposited over the surface of the passivation layer 18. A resistor 48 has been created on the surface of the layer 20 of polyimide. The resistor 48 is created connecting the two contact pads 16 with a thin high resistivity layer of metal. By increasing the distance between the body of the resistor and the surface of substrate (by the thickness of the poly layer 20) the parasitic capacitance between the body of the resistor and the substrate is reduced resulting in an improved resistive component (reduced parasitic capacitive loss, improved high frequency performance).

Figure 10:
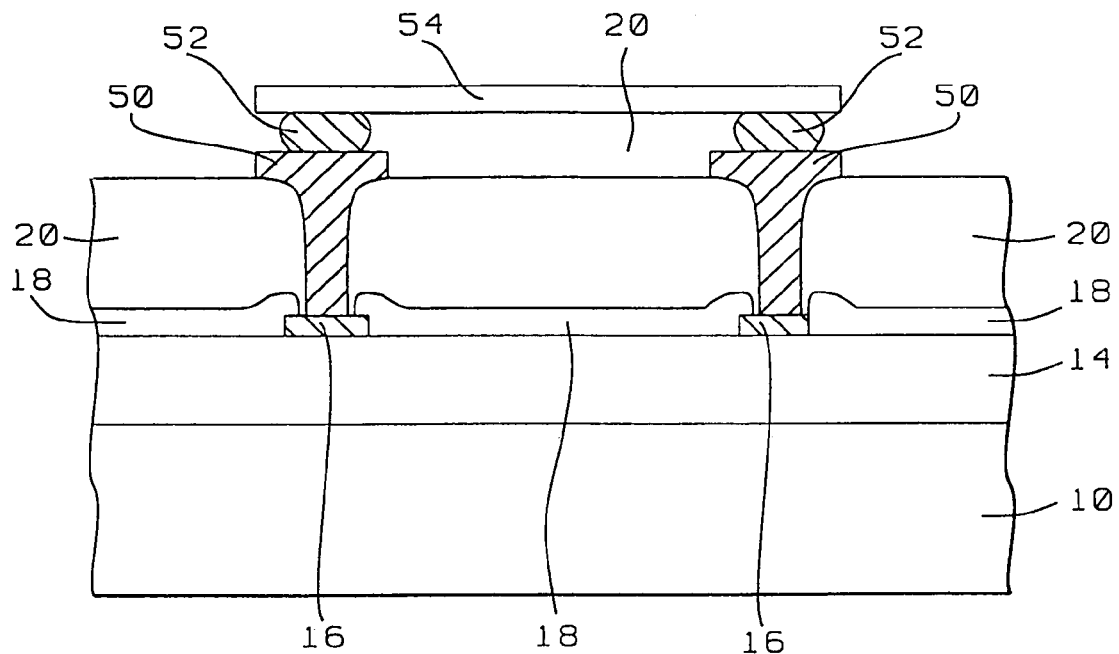
FIG. 10 shows a cross section of a silicon substrate on the surface of which a discrete electrical component has been mounted, contact balls are used whereby the distance between the substrate and the electrical component is of a significant value, a thick layer of polyimide has been used.
Figure 11:
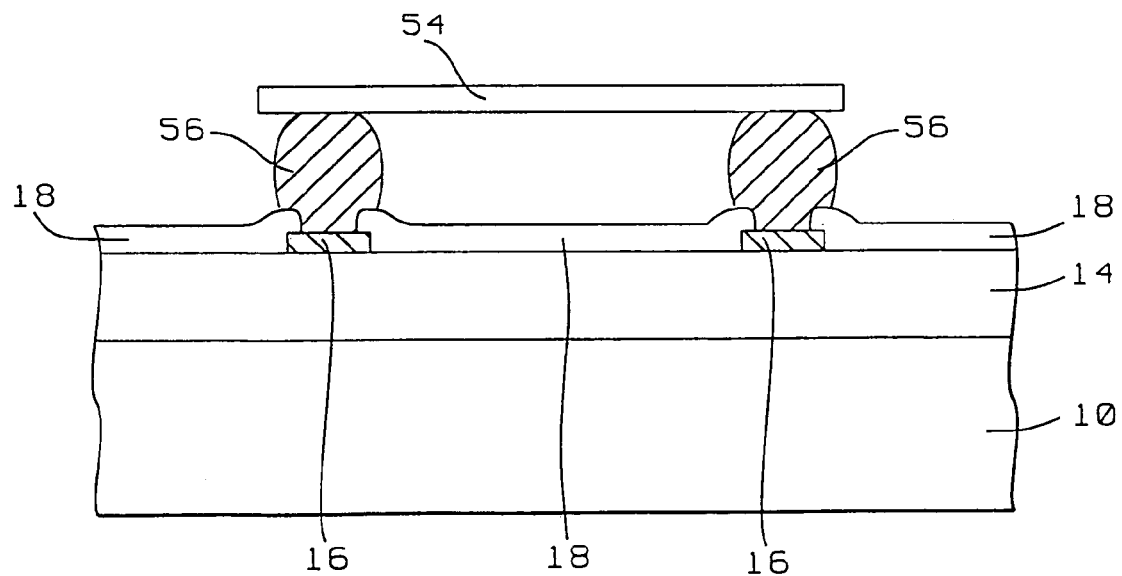
FIG. 11 shows a cross section of a silicon substrate on the surface of which a discrete electrical component has been mounted, thick contact balls are used whereby the distance between the substrate and the electrical component is of a significant value, no layer of polyimide has been used.

Further applications of the post-passivation processing of the invention are shown in FIGS. 10 and 11, which concentrate on making ball contact points between contact pads 16 and an overlying electric component, such as a discrete inductor. Proceeding from the surface of substrate 10 in an upward direction, most of the layers that are shown in FIG. 10 have previously been identified and are identified in FIG. 10 using the same numerals as have previously been used for these layers. Where FIG. 10 shows previously not identified layers is in:

50, contact plugs that have been formed through the thick layer 20 of polymer 52, contact balls that have been formed on the surface of the contact plugs 50 using conventional methods of selective solder deposition (plating or ball mounting on the surface of plugs 50), the application of a flux on the deposited solder and flowing the solder to form the contact balls 52, and 54, a cross section of a discrete electrical component such as an inductor or a discrete capacitor or a resistor.

FIG. 11 shows a cross section of a silicon substrate 10 on the surface of which a discrete electrical component 54 has been mounted, contact balls 56 are used whereby the distance between the substrate 10 and the electrical component 54 is of a significant value. Contact balls are inserted into the openings that have been created in the layer 18 of passivation overlying the contact pads 16, the (relatively large) contact balls 56 create a significant separation between the surface of substrate 10 and the discrete electrical component 54.

The methods that have been shown in FIGS. 10 and 11 indicate that:

the passive component 54 is removed from the surface of substrate 10 by a significant distance, and instead of mounting the passive, discrete component 54 on the surface of a Printed Circuit Board (PCB), the passive component 54 can be mounted closer to a semiconductor device in the present invention.

Throughout the methods and procedures that have been explained above using the examples that are shown in cross section in the accompanying drawings, the following has been adhered to:

the passive components have been further removed from the silicon substrate, thereby reducing the negative impact that is induced by the substrate due to electromagnetic losses incurred in the substrate the post-passivation process of the invention allows for the selection of discrete component design parameters that result in reduced resistance of the discrete capacitor and the discrete inductor, this is further clear from the following comparison between prior art processes and the processes of the invention.

Prior art requires for the creation of an inductor:

the use of thin metal, which imposes the creation of wide coils for an inductor resulting in increased surface area that is required for the inductor which in turn increases the parasitic capacitance of the inductor causing eddy current losses in the surface of the substrate.

The present invention by contrast:

can use thick metal, since the metal of the passive component is (by the thick layer of polymer) removed from the (thin metal) interconnect layer 14, and (as a consequence)

reduces the surface area that is required for the inductor, and reduces the resistivity of the inductor, thereby increasing the Q value of the inductor.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A chip comprising:

a silicon substrate;

a transistor in or on said silicon substrate;

a metallization structure over said silicon substrate, wherein said metallization structure comprises a first metal layer and a second metal layer over said first metal layer;
a dielectric layer between said first and second metal layers;
a pad over said silicon substrate, wherein said pad has a top surface with a first region and a second region surrounding said first region;
a passivation layer over said metallization structure and over said dielectric layer, wherein said passivation layer is on said second region, and an opening in said passivation layer is over said first region, wherein said opening exposes said first region, wherein said opening has a width smaller than that of said pad, and wherein said opening has a transverse dimension between 0.5 and 30 micrometers, and wherein said passivation layer comprises a nitride layer;
a polymer layer over said passivation layer, wherein said polymer layer has a thickness greater than that of said passivation layer and between 2.0 and 150 μm;
a gold coil over said polymer layer, wherein said gold coil comprises an electroplated gold layer having a thickness greater than that of said pad, and wherein said gold coil is connected to said pad through said opening; and
a third metal layer between said passivation layer and said polymer layer and under said gold coil.

2. The chip of claim 1, wherein said third metal layer comprises a gold layer between said passivation layer and said polymer layer and under said gold coil.

3. The chip of claim 1, wherein said third metal layer comprises a copper layer between said passivation layer and said polymer layer and under said gold coil.

4. The chip of claim 1, wherein said polymer layer comprises polyimide.

5. The chip of claim 1, wherein said passivation layer further comprises an oxide layer under said nitride layer.

6. The chip of claim 5, wherein said oxide layer has a thickness between 0.15 and 2.0 micrometers.

7. The chip of claim 1, wherein said nitride layer has a thickness between 0.5 and 2.0 micrometers.

8. The chip of claim 1, wherein said polymer layer comprises benzocyclobutene (BCB).

9. The chip of claim 1, wherein said pad comprises electroplated copper.

10. The chip of claim 1, wherein said pad comprises aluminum.

11. The chip of claim 1, wherein said third metal layer comprises an aluminum layer between said passivation layer and said polymer layer and under said gold coil.

12. The chip of claim 1, wherein said third metal layer comprises a layer of ferromagnetic material between said passivation layer and said polymer layer and under said gold coil.

13. The chip of claim 1 further comprising electroplated copper in said opening, over said pad and under said gold coil.

14. The chip of claim 1 further comprising nickel over said pad and under said gold coil.

* * * * *